(12) United States Patent
Zhao et al.

(10) Patent No.: US 10,506,718 B2
(45) Date of Patent: Dec. 10, 2019

(54) DISPLAY PANEL, DETECTION METHOD THEREOF, FLEXIBLE PRINTED CIRCUIT AND DISPLAY DEVICE

(71) Applicants: BOE Technology Group Co., Ltd., Beijing (CN); Hefei BOE Optoelectronics Technology Co., Ltd., Hefei, Anhui (CN)

(72) Inventors: Xuemei Zhao, Beijing (CN); Hu Li, Beijing (CN); Jian He, Beijing (CN); Zhi Zhang, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 0 days.

(21) Appl. No.: 16/036,033

(22) Filed: Jul. 16, 2018

(65) Prior Publication Data

US 2019/0116672 A1    Apr. 18, 2019

(30) Foreign Application Priority Data

Oct. 17, 2017  (CN) .......................... 2017 1 0966808

(51) Int. Cl.
  *H05K 1/14*    (2006.01)
  *H01L 23/58*   (2006.01)
  (Continued)

(52) U.S. Cl.
  CPC .......... *H05K 1/189* (2013.01); *G01R 31/2825* (2013.01); *G02F 1/133305* (2013.01);
  (Continued)

(58) Field of Classification Search
  CPC .......... H05K 1/14; H01L 23/58; G01R 27/26; G09G 5/00; G09G 3/00
  (Continued)

(56) References Cited

U.S. PATENT DOCUMENTS 5,592,199 A * 1/1997 Kawaguchi ......... G02F 1/13452
                                            257/E23.065
6,043,669 A * 3/2000 Carroll ................ G01R 1/0735
                                            324/750.26
(Continued)

FOREIGN PATENT DOCUMENTS

CN    205643942 U    10/2016
CN    106959529 A    7/2017
(Continued)

OTHER PUBLICATIONS

Chinese Office Action for counterpart 201710966808.9 dated Feb. 26, 2019.

*Primary Examiner* — Xiaoliang Chen
(74) *Attorney, Agent, or Firm* — Arent Fox LLP; Michael Fainberg

(57) ABSTRACT

The disclosure discloses a display panel, a detection method thereof, a flexible printed circuit, and a display device. The flexible printed circuit includes a second bonding area, a plurality of contact pins and at least one test pin group are arranged in the second bonding area; the contact pins are configured to be bonded respectively with corresponding contact pads in the first bonding area; the test pin group is configured to be bonded with a corresponding test pad group in the first bonding area; the test pin group includes test pins; and the test pin group is configured so that after bonding, bonding states of the contact pins with the contact pads are determined by detecting conducting or non-conducting state between the test pins and the corresponding test pads.

12 Claims, 5 Drawing Sheets

(51) Int. Cl.
*G01R 27/26* (2006.01)
*G09G 5/00* (2006.01)
*G09G 3/00* (2006.01)
*H05K 1/18* (2006.01)
*G01R 31/28* (2006.01)
*G02F 1/1333* (2006.01)
*H05K 1/02* (2006.01)
*H05K 1/11* (2006.01)
*H05K 3/36* (2006.01)

(52) U.S. Cl.
CPC .......... *H05K 1/0268* (2013.01); *H05K 1/118* (2013.01); *H05K 3/361* (2013.01); *H05K 2201/09781* (2013.01); *H05K 2201/09918* (2013.01)

(58) Field of Classification Search
USPC ........ 361/749, 760, 803; 324/414, 537, 686, 324/719, 760.01; 345/60, 206, 211
See application file for complete search history.

(56) References Cited

U.S. PATENT DOCUMENTS

| | | | | |
|---|---|---|---|---|
| 6,798,232 B2* | 9/2004 | Lim | .................... | G02F 1/13452 324/760.01 |
| 7,408,189 B2* | 8/2008 | Lin | ...................... | G01R 31/046 257/48 |
| 2006/0238450 A1* | 10/2006 | Onodera | ............... | G02F 1/1309 345/60 |
| 2009/0309911 A1* | 12/2009 | Kim | ...................... | B41J 2/14072 347/14 |
| 2010/0295567 A1* | 11/2010 | Chang | .................. | G01R 31/046 324/719 |
| 2011/0140720 A1* | 6/2011 | Kurashima | ............. | G06F 3/044 324/686 |
| 2012/0327056 A1* | 12/2012 | Lee | ........................ | G09G 3/006 345/211 |
| 2014/0029219 A1* | 1/2014 | Oh | .......................... | H05K 7/06 361/760 |
| 2014/0029230 A1* | 1/2014 | Oh | .......................... | H05K 1/14 361/803 |
| 2015/0198641 A1* | 7/2015 | Moon | .................. | G02F 1/0121 324/537 |
| 2016/0313392 A1* | 10/2016 | Dong | ................. | G01R 31/2884 |
| 2016/0379906 A1* | 12/2016 | Kim | ..................... | G09G 3/3688 257/48 |
| 2017/0123570 A1* | 5/2017 | Maruyama | ............. | G06F 3/041 |
| 2017/0141181 A1* | 5/2017 | Ni | ........................... | G09G 3/006 |
| 2017/0263165 A1* | 9/2017 | Guo | ........................ | G02F 1/1309 |
| 2018/0018910 A1* | 1/2018 | Jang | ....................... | G09G 3/006 |
| 2018/0277029 A1* | 9/2018 | Lee | ........................ | G09G 3/006 |
| 2019/0116662 A1 | 4/2019 | Li et al. | | |

FOREIGN PATENT DOCUMENTS

| | | |
|---|---|---|
| CN | 206311727 U | 7/2017 |
| JP | 2001156417 A | 6/2001 |

* cited by examiner

DISPLAY PANEL, DETECTION METHOD THEREOF, FLEXIBLE PRINTED CIRCUIT AND DISPLAY DEVICE

CROSS-REFERENCES TO RELATED APPLICATIONS

This application claims priority to Chinese patent application No. 201710966808.9 filed on Oct. 17, 2017, which is incorporated herein by reference in its entirety.

FIELD

The present disclosure relates to the field of display technologies, and particularly to a display panel, a detection method thereof, a flexible printed circuit and a display device.

BACKGROUND

With the development of the display technologies, display screens or touch screens have been widely applied to our life. The Liquid Crystal Display (LCD) has characteristics of a small volume, low power consumption, no radiation, etc., and the Organic Light-Emitting Diode (OLED) display has the advantages of self-luminescence, a rapid response, a wide angle of view, high brightness, high chroma, a low weight, a small thickness, etc.

In the related art, a plurality of contact pads are arranged in a bonding area of a display panel, and a plurality of contact pins are arranged in a bonding area on a flexible printed circuit. It is typical in a bonding process of a display screen or a touch screen to bond the contact pins on the Flexible Printed Circuit (FPC) with the contact pads on the display panel through an Anisotropic Conductive Film (ACF). However temperature, a pressure, an alignment process, or another condition in the bonding process is typically inappropriate, thus after bonding a part or all of the contact pads on the display panel may be disconnected from the contact pins, or adjacent contact pads or adjacent contact pins may be short-circuited.

SUMMARY

In one aspect, an embodiment of the disclosure provides a flexible printed circuit. The flexible printed circuit includes a second bonding area to be bonded with a first bonding area on a display panel, wherein: a plurality of contact pins and at least one test pin group are arranged in the second bonding area; the plurality of contact pins are connected with corresponding signal lines on the flexible printed circuit, and configured to be bonded respectively with a plurality of corresponding contact pads in the first bonding area; the test pin group is configured to be bonded with a corresponding test pad group in the first bonding area; the test pin group includes a plurality of test pins, corresponding to a plurality of test pads in the test pad group, and the test pins are configured to be bonded with the corresponding test pads; and the test pin group is further configured so that after the first bonding area is bonded with the second bonding area, bonding states of the plurality of contact pins with the plurality of contact pads are determined by detecting conducting or non-conducting state between the test pins and the corresponding test pads.

In another aspect, an embodiment of the disclosure provides a display panel. The display panel includes a base substrate, a first bonding area on the base substrate and the flexible printed circuit above, wherein: the first bonding area is bonded with the second bonding area on the flexible printed circuit; a plurality of contact pads connected with corresponding signal lines on the display panel and at least one test pad group are arranged in the first bonding area; the test pad group includes a plurality of test pads, and the test pads are configured to be bonded with the corresponding test pins in the second bonding area; and the test pad group is configured so that bonding states of the plurality of contact pins with the plurality of contact pads are determined by detecting conducting or non-conducting state between the test pads with and the corresponding test pads.

In some embodiments, in the display panel, each test pad group includes at least two test pads connected with each other and at least two test pads disconnected from each other, and the corresponding test pins in the corresponding test pin group are arranged floating; or each test pin group includes at least two test pins connected with each other and at least two test pins disconnected from each other, and the corresponding test pads in the corresponding test pad group are arranged floating.

In some embodiments, in the display panel, the contact pads and the test pads in the first bonding area are located in the same row or column, and the test pads are of the same size and shape as the contact pads; and the contact pins and the test pins in the second bonding area are located in the same row or column, and the test pins are of the same size and shape as the contact pins.

In some embodiments, in the display panel, the spacing between any two adjacent pads among the test pads and the contact pads in the same row or column is the same; and the spacing between any two adjacent pins among the test pins and the contact pins in the same row or column is the same.

In some embodiments, in the display panel, at least two alignment pads are arranged on two ends of the row or column of contact pads and test pads in the first bonding area; and at least two alignment pins are arranged on two ends of the row or column of contact pins and test pins in the second bonding area.

In some embodiments, in the display panel, at least three test pad groups are arranged in the first bonding area, and the test pad groups are located respectively at the center and two ends of the first bonding area; and at least three corresponding test pin groups are arranged in the second bonding area, and the test pin groups are located respectively at the center and two ends of the second bonding area.

In some embodiments, in the display panel, the test pad group includes three test pads, and the two test pads connected with each other are two test pads spaced by another test pad; or the test pin group includes three test pins, and the two test pins connected with each other are two test pins spaced by another test pin.

In some embodiments, in the display panel, the test pads in the test pad group are arranged floating, and first test terminals connected with the test pads in a one-to-one manner are arranged in the first bonding area, wherein the first test terminals are connected with the corresponding test pads through wires; or the test pins in the test pin group are arranged floating, and second test terminals connected with the test pins in a one-to-one manner are arranged in the second bonding area, wherein the second test terminals are connected with the corresponding test pins through wires.

In another aspect, an embodiment of the disclosure provides a detection method of the display panel above, wherein each test pad group includes at least two test pads connected with each other and at least two test pads disconnected from each other, and the corresponding test pins in the corresponding test pin group are arranged floating. The detection method includes: detecting a first connection state between two test pins corresponding to the test pads connected with each other; detecting a second connection state between two test pins corresponding to the test pads disconnected from each other; and determining bonding states between contact pads and corresponding contact pins according to the first connection state and the second connection state, wherein when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

In some embodiments, in the detecting method, second test terminals, connected with the test pins in a one-to-one manner, are arranged in the second bonding area; the detecting the first connection state between the two test pins corresponding to the test pads connected with each other includes: detecting a connection state between two second test terminals corresponding to the test pads connected with each other; and the detecting the second connection state between the two test pins corresponding to the test pads disconnected from each other includes: detecting a connection state between two second test terminals corresponding to the test pads disconnected from each other.

In another aspect, an embodiment of the disclosure provides a detection method of the display panel above, wherein each test pin group includes at least two test pins connected with each other and at least two test pins disconnected from each other, and the corresponding test pads in the corresponding test pad group are arranged floating. The detection method includes: detecting a first connection state between two test pads corresponding to the test pins connected with each other; detecting a second connection state between two test pads corresponding to the test pins disconnected from each other; and determining bonding states between contact pads and corresponding contact pins according to the first connection state and the second connection state, wherein when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

In some embodiments, in the detecting method, first test terminals, connected with the test pads in a one-to-one manner, are arranged in the first bonding area; the detecting the first connection state between the two test pads corresponding to the test pins connected with each other includes: detecting a connection state between two first test terminals corresponding to the test pins connected with each other; and the detecting the second connection state between the two test pads corresponding to the test pins disconnected from each other includes: detecting a connection state between two first test terminals corresponding to the test pins disconnected from each other.

In another aspect, an embodiment of the disclosure provides a display device including a display panel. The display panel includes a base substrate, a first bonding area on the base substrate and the flexible printed circuit above, wherein: the first bonding area is bonded with the second bonding area on the flexible printed circuit; a plurality of contact pads connected with corresponding signal lines on the display panel and at least one test pad group are arranged in the first bonding area; the test pad group includes a plurality of test pads, and the test pads are configured to be bonded with the corresponding test pads in the second bonding area; and the test pad group is configured so that bonding states of the plurality of contact pins with the plurality of contact pads are determined by detecting conducting or non-conducting state between the test pads with and the corresponding test pads.

BRIEF DESCRIPTION OF THE DRAWINGS

In order to make the technical solutions in the embodiments of the disclosure more apparent, the drawings to be used in a description of the embodiments will be briefly introduced below, and apparently the drawings to be described below are merely illustrative of some embodiments of the disclosure, and those ordinarily skilled in the art can derive from these drawings other drawings without any inventive effort.

DETAILED DESCRIPTION

Figure 1:
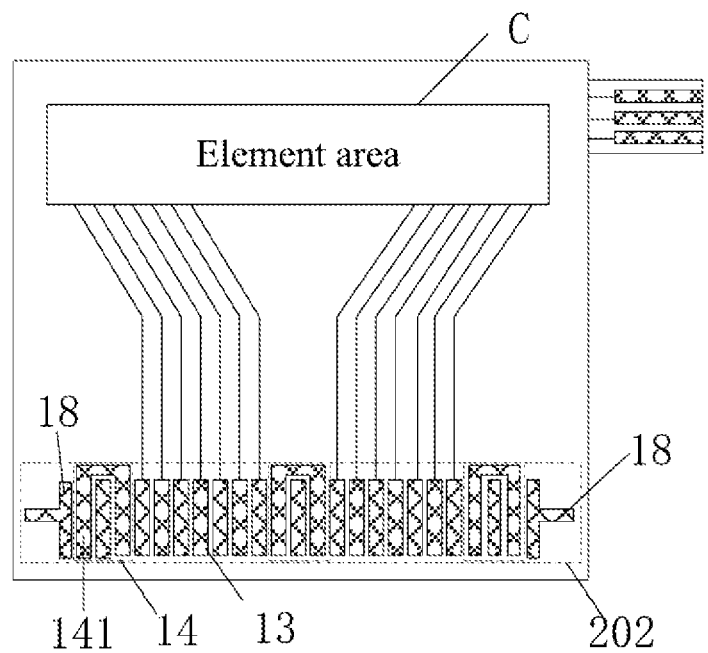
FIG. 1 is a first schematic structural diagram of a flexible printed circuit in accordance with an embodiment of the disclosure.

The technical solutions of the embodiments of the disclosure will be described clearly and completely below in combination with the accompanying drawings, and apparently the embodiments described below are only a part but not all of the embodiments of the disclosure. Based upon the embodiments of the disclosure, all the other embodiments which can occur to those skilled in the art without any inventive effort shall fall into the scope of the disclosure.

Typically some elements, e.g., diodes, etc., may be soldered on an element area on the FPC, where the FPC with the soldered elements can be referred to as a Flexible Printed Circuit Assembly (FPCA). After the display panel is bonded with the flexible printed circuit, the bonding state of the flexible printed circuit with the elements (i.e., the FPCA) cannot be determined by testing the channel resistance, and even for the simple FPC without any elements, the bonding effect shall be determined by inserting probes of a multimeter into the contact pins on the flexible printed circuit (referred to as golden fingers), but the contact pins may be easily broken in this scheme of detecting the bonding effect.

In view of the problem in the related art of failing to detect in effect a bonding effect, embodiments of the disclosure provide a display panel, a detection method thereof, a flexible printed circuit, and a display device.

Implementations of the display panel, the detection method thereof, the flexible printed circuit, and the display device according to the embodiments of the disclosure will be described below in details with reference to the drawings. The sizes and shapes of respective components in the drawings are not intended to reflect any real proportion, but merely intended to illustrate the content of the disclosure.

Figure 2:
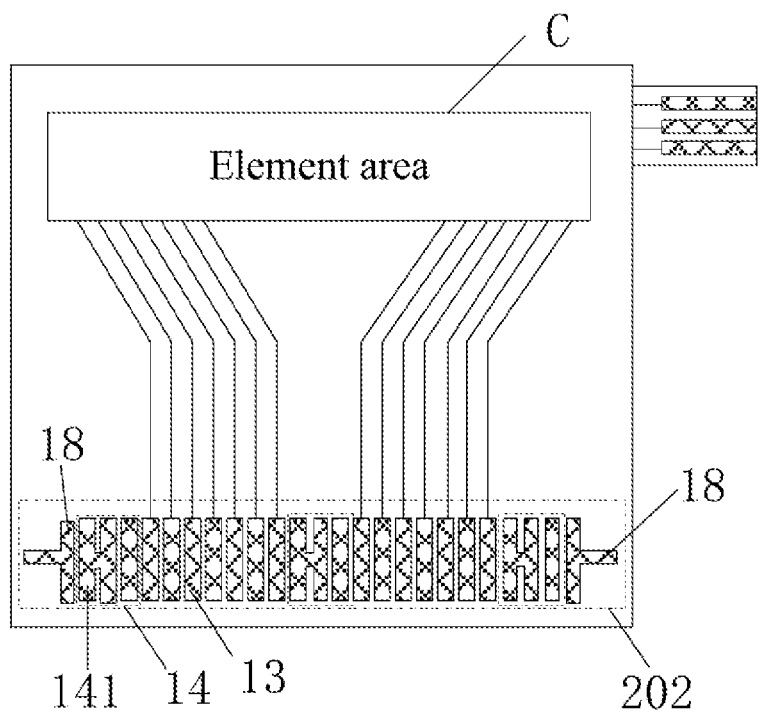
FIG. 2 is a second schematic structural diagram of a flexible printed circuit in accordance with an embodiment of the disclosure.
Figure 3:
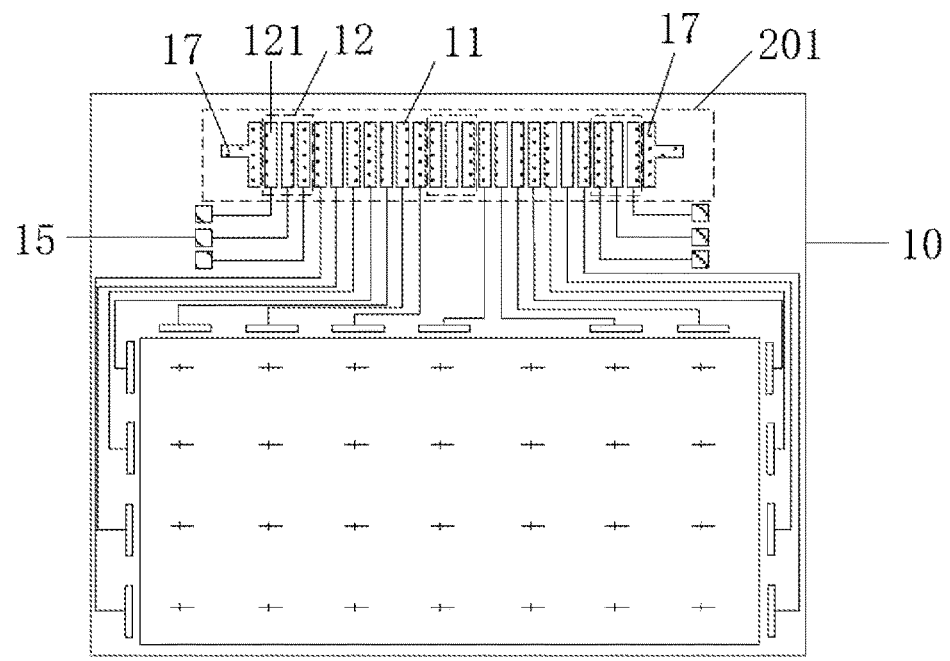
FIG. 3 is a first schematic structural diagram of a display panel in accordance with an embodiment of the disclosure.
Figure 4:
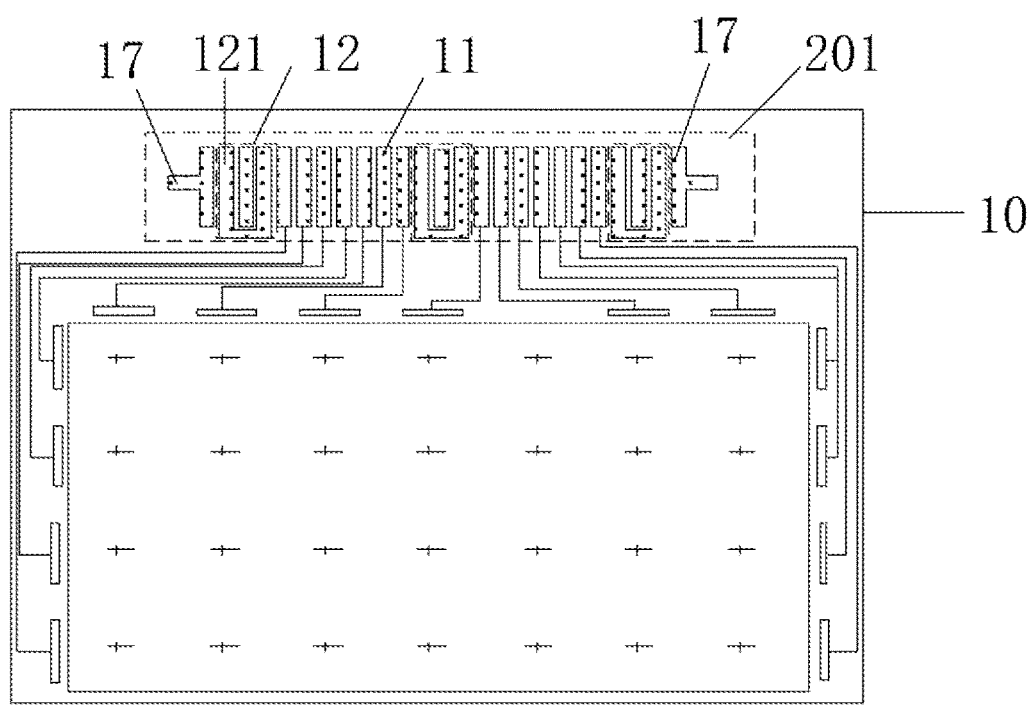
FIG. 4 is a second schematic structural diagram of a display panel in accordance with an embodiment of the disclosure.
Figure 5:
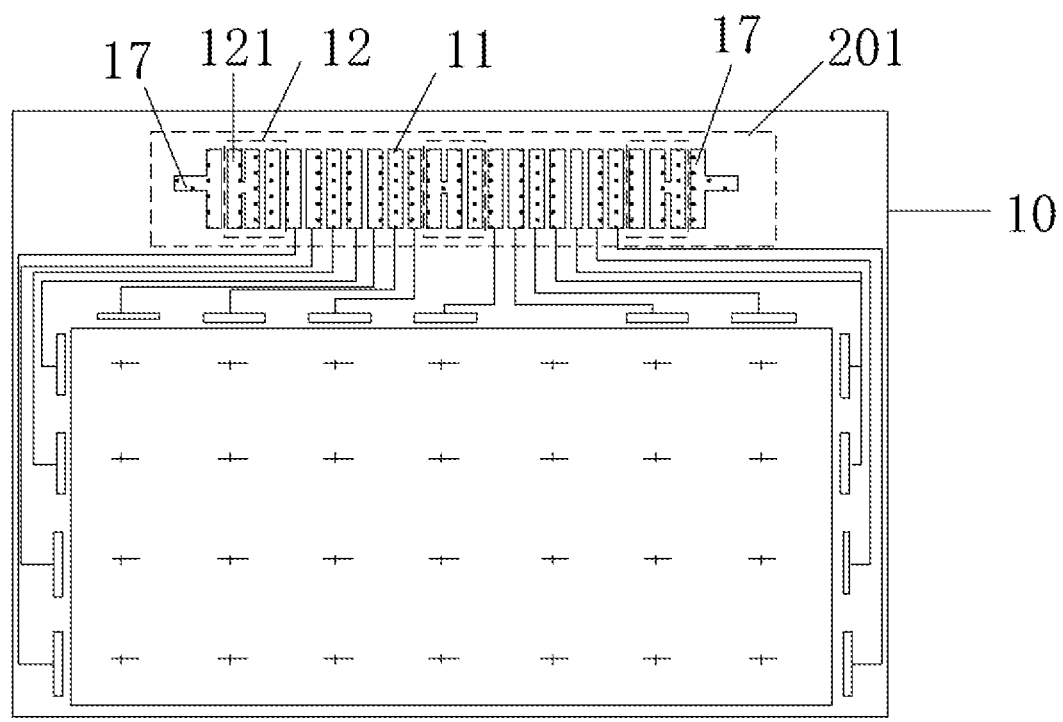
FIG. 5 is a third schematic structural diagram of a display panel in accordance with an embodiment of the disclosure.
Figure 6:
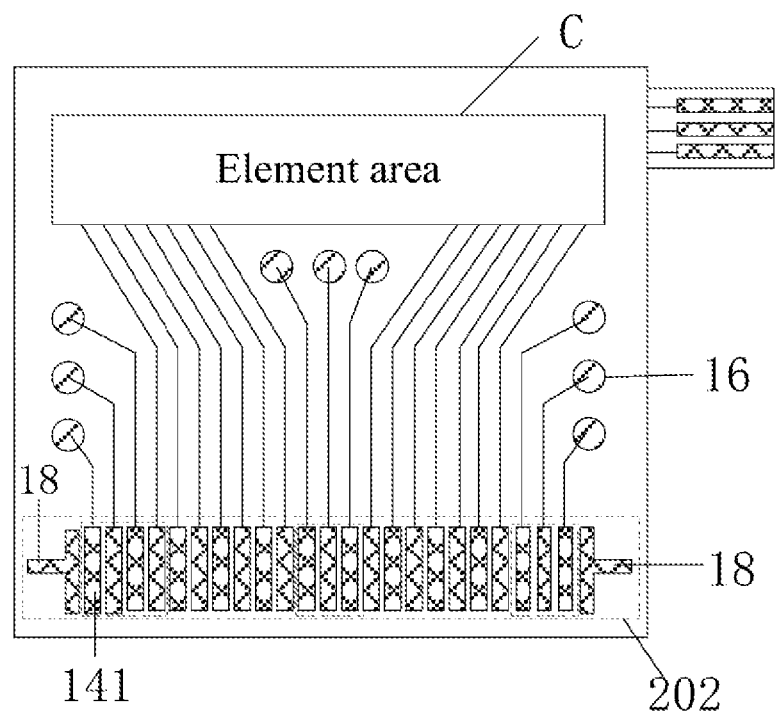
FIG. 6 is a third schematic structural diagram of a flexible printed circuit in accordance with an embodiment of the disclosure.
Figure 7A:
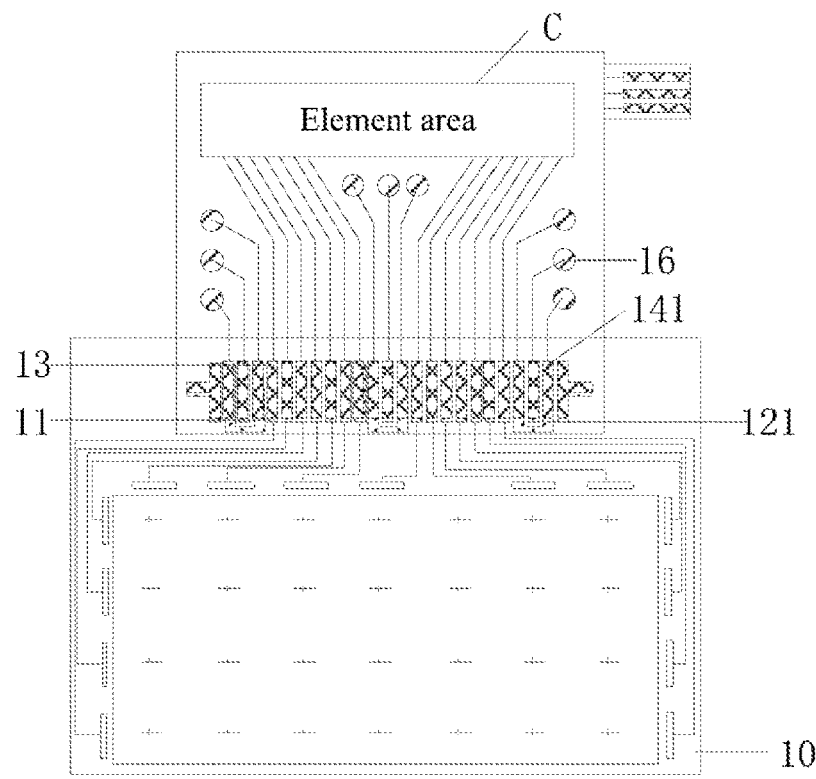
FIG. 7A is a schematic structural diagram of the bonded display panel.
Figure 7B:
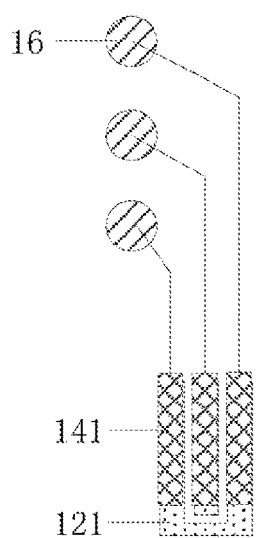
FIG. 7B is a partial enlarged diagram of FIG. 7A.

In the embodiments of the disclosure, FIG. 1 and FIG. 2 are schematic structural diagrams respectively of a flexible printed circuit applicable to a display panel, and FIG. 3 is a schematic structural diagram of the display panel corresponding to the flexible printed circuit illustrated in FIG. 1 or FIG. 2; FIG. 4 and FIG. 5 are schematic structural diagrams of a display panel, and FIG. 6 is a schematic structural diagram of a flexible printed circuit corresponding to the display panel illustrated in FIG. 4 or FIG. 5; and FIG. 7A is a schematic structural diagram of the display panel illustrated in FIG. 4 bonded with the flexible printed circuit illustrated in FIG. 6, and FIG. 7B is a partial enlarged diagram of FIG. 7A.

In one aspect, an embodiment of the disclosure provides a flexible printed circuit applicable to a display panel, As illustrated in FIG. 1 to FIG. 3. the flexible printed circuit includes: a second bonding area 202 to be bonded with a first bonding area 201 on the display panel.

A plurality of contact pins 13 and at least one test pin group 14 are arranged in the second bonding area 202.

The plurality of contact pins 13 are connected with corresponding signal lines on the flexible printed circuit, and configured to be bonded respectively with a plurality of corresponding contact pads 11 in the first bonding area 201.

The test pin group 14 is configured to be bonded with a corresponding test pad group 12 in the first bonding area 201.

The test pin group 14 includes a plurality of test pins 141, the test pad group 12 includes a plurality of test pads 121, and the test pins 141 are configured to be bonded with the corresponding test pads 121.

The test pin group 14 is further configured so that after the first bonding area 201 is bonded with the second bonding area 202, bonding states of the plurality of contact pins 13 with the plurality of contact pads 11 are determined by detecting conducting or non-conducting state between the test pins 141 and the corresponding test pads 121.

In the flexible printed circuit according to the embodiment of the disclosure, the test pin group is arranged in the second bonding area so that after the flexible printed circuit is subsequently bonded with the display panel, a bonding state between the display panel and the flexible printed circuit can be determined by detecting the conducting or non-conducting states between the test pins and the corresponding test pads. In this way, a bonding effect can be detected in effect, rapidly, and in a simple process without any additional process.

As illustrated in FIG. 1 and FIG. 2, the second bonding area 202 on the flexible printed circuit is generally located on the edge of the flexible printed circuit, and as illustrated in FIG. 3, the first bonding area 201 on the display panel is generally located on the edge of the display panel, so that the second bonding area 202 can be bonded conveniently with the first bonding area 201. The contact pins 13 on the flexible printed circuit are generally connected with the corresponding signal lines in the flexible printed circuit, and the contact pads 11 on the display panel are generally connected with corresponding signal lines in the display panel, so that after the contact pads 11 are bonded with the corresponding contact pins 13, the signal lines on the display panel can be connected with the corresponding signal lines on the flexible printed circuit.

In some embodiments, the contact pads 11 on the display panel are bonded with the contact pins 13 on the flexible printed circuit through an Anisotropic Conductive Film (ACF), and conductive particles in the conductive film can be exploded normally at specific temperature and pressure so that the contact pads 11 are well bonded with the corresponding contact pins 13. Therefore the bonding effect between the contact pads 11 and the corresponding contact pins 13 depends upon temperature, pressure, alignment, and other process condition in the bonding process. Since all the contact pads 11 on the display panel are bonded with the corresponding contact pins 13 on the flexible printed circuit under the same process condition in the bonding process, the bonding states of the respective bonding pads 11 with the corresponding contact pins 13 can be determined by detecting a bonding state between a group of bonding pad 11 and the corresponding contact pin 13. Accordingly in the embodiment of the disclosure, the bonding state between the display panel and the flexible printed circuit can be determined by detecting the bonding states between the test pins 141 and the corresponding test pads 121.

In another aspect, an embodiment of the disclosure further provides a display panel. As illustrated in FIG. 3 (in order to illustrate the structure of a first bonding area 201 more clearly, FIG. 3 does not illustrate the flexible printed circuit to be bonded on the display panel), the display panel includes: a base substrate 10, a first bonding area 201 on the base substrate 10, and the flexible printed circuit above.

The first bonding area 201 is bonded with the second bonding area 202 on the flexible printed circuit.

A plurality of contact pads 11 connected with corresponding signal lines on the display panel and at least one test pad group 12 are arranged in the first bonding area 201.

The test pad group 12 includes a plurality of test pads 121, and the respective test pads 121 are configured to be bonded with the corresponding test pins 141 in the second bonding area.

The test pad group 12 is configured so that bonding states of the plurality of contact pins 13 with the plurality of contact pads 11 are determined by detecting conducting or non-conducting state between the test pads 121 and the corresponding test pins 141.

In the display panel according to the embodiment of the disclosure, the test pad group 12 is arranged in the first bonding area 201 on the display panel, and the test pin group 14 is arranged in the second bonding area 202 on the flexible printed circuit, so that after the flexible printed circuit is subsequently bonded with the display panel, a bonding state between the display panel and the flexible printed circuit can be determined by detecting the conducting or non-conducting state between the test pins 141 and the corresponding test pads 121, and in this way, a bonding effect can be detected in effect, rapidly, and in a simple process without any additional process.

Specifically in the display panel above according to the embodiment of the disclosure, the test pad group 12 and the corresponding test pin group 14 can be structurally arranged in at least the following two implementations.

In a first implementation, referring to FIG. 4 and FIG. 5, each test pad group includes at least two test pads 121 connected with each other and at least two test pads 121 disconnected from each other, and the corresponding test pins 141 in the corresponding test pin group 14 are arranged floating (as illustrated in FIG. 6).

Specifically each test pad group 12 includes at least three test pads 121 so that there are at least two test pads 121 connected with each other, and at least two test pads 121 disconnected from each other. And the corresponding test pins 141 in the corresponding flexible printed circuit are arranged floating, so after the test pads 121 in the test pad group 12 on the display panel are bonded with the corresponding test pins 141 in the flexible printed circuit, the bonding states between the test pads 121 and the corresponding test pins 141 can be determined by detecting resistances between the test pins 141, to thereby determine the bonding states between the contact pads 11 on the display panel and the corresponding contact pins 13 on the flexible printed circuit.

It shall be noted that in the embodiment of the disclosure, "floating" can refer to being not connected with any signal line, that is, no signal is applied in use. In the embodiment of the disclosure, the test pins 141 are arranged floating, so that after the test pins 141 are added in the second bonding area 202, signals in the contact pins 13 cannot be affected; and alike the test pads 121 can also be subsequently arranged floating so that signals in the contact pads 11 cannot be affected.

In a second implementation, referring to FIG. 1 and FIG. 2, each test pin group 14 includes at least two test pins 141 connected with each other and at least two test pins 141 disconnected from each other, and the corresponding test pads 121 in the corresponding test pad group 12 are arranged floating (as illustrated in FIG. 3).

Specifically each test pin group includes at least three test pins 141 so that there are at least two test pins 141 connected with each other and at least two test pins 141 disconnected from each other. And the corresponding test pads 121 in the display panel are arranged floating, so after the test pads 121 in the test pad group 12 on the display panel are bonded with the corresponding test pins 141 in the flexible printed circuit, the bonding states between the test pins 141 and the corresponding test pads 121 can be determined by detecting resistances between the test pads 121, to thereby determine the bonding states between the contact pins 13 on the flexible printed circuit, and corresponding contact pads 11 on the display panel.

In some embodiments of the disclosure, in the display panel, as illustrated in FIG. 5 and FIG. 6, the contact pads 11 and the test pads 121 in the first bonding area 201 are located in the same row or column, and the test pads 121 are of the same size and shape as the contact pads 11.

In a specific implementation, the contact pins 13 on the flexible printed circuit are bonded with the contact pads 11 on the display panel, so that the signal lines on the flexible printed circuit are connected with the corresponding signal lines on the display panel. The contact pads 11 and the test pads 121 in the first bonding area 201 are arranged in the same row or column, and the corresponding contact pins and test pins on the flexible printed circuit can also be arranged in the same row or column, so that there are short distances between the contact pads 11 and the corresponding contact pins 13, and between the test pads 121 and the corresponding test pins 141 in the bonding process, thus making the bonding process more convenient.

In some embodiments, referring to FIG. 5 and FIG. 6 again, the test pads 121 are of the same size and shape as the contact pads 11. The test pads 121 and the contact pads 11 are set in the same size and shape, and other parameters of the test pads 121 are same as those of the contact pads 11 except that they are connected with different signal lines, so bonding effects of the contact pads 11 can be reflected accurately by detecting bonding effects of the test pads 121, to thereby make a result of detecting a bonding state more reliable. Furthermore the respective test pads 121 and the respective contact pads 11 in the first bonding area 201 can be further arranged at a uniform interval, and optionally, the material of the test pads 121 is the same as the material of the contact pads 11.

Alike, as illustrated in FIG. 1 and FIG. 2, the contact pins 13 and the test pins 141 in the second bonding area 202 are located in the same row or column, and optionally the test pins 141 and the contact pins 13 are of the same size and shape.

Specifically in the display panel above according to the embodiment of the disclosure, as illustrated in FIG. 4 and FIG. 5, the spacing between any two adjacent pads among the respective test pads 121 and the respective contact pads 11 in the same row or column is the same, that is, the respective test pads 121 and the respective contact pads 11 in the same row or column are distributed uniformly, and the spacing between adjacent test pads 121, between adjacent contact pads 11, or between a test pad 121 and a contact pad 11 adjacent thereto is the same. For example, a first test pad, a second test pad, a third test pad, a first contact pad, a second contact pad, a third contact pad, . . . , are arranged in the first bonding area, then the spacing between the first test pad and the second test pad, the spacing between the third test pad and the first contact pad, and the spacing between the second contact pad and the third contact pad are the same.

Alike, as illustrated in FIG. 1 and FIG. 2, there is the same spacing between adjacent pins among the respective test pins 141 and the respective contact pins 13 in the same row or column.

In a real application, in the display panel above according to the embodiment of the disclosure, as illustrated in FIG. 5 and FIG. 6, at least two alignment pads 17 are arranged on two ends of the row or column of contact pads 11 and test pads 121 in the first bonding area 201.

Referring to FIG. 5 and FIG. 6, the contact pads 11 on two ends of the first bonding area 201 are slightly different in shape from the other contact pads 11, so that these two contact pads 11 can be used as alignment marks in the process. FIG. 5 and FIG. 6 illustrate the contact pads 11 and the test pads 121 as rectangles, and the alignment pads 17 on the two ends as "T", for example, but in a specific implementation, the contact pads 11, the test pads 121, and the alignment pads 17 can alternatively be arranged in other shapes and sizes. The shapes and sizes of the contact pads 11, the test pads 121 and the alignment pads 17 will not be limited to any specific shapes and sizes in the embodiment of the disclosure.

Alike, as illustrated in FIG. 1 and FIG. 2, at least two alignment pins 18 are arranged on two ends of the row or column of contact pins 13 and test pins 141 in the second bonding area 202.

Referring to FIG. 1 and FIG. 2, the contact pins 13 on two ends of the second bonding area 202 are slightly different in shape from the other contact pins 13, so that these two contact pins 13 can be used as alignment marks in the process. FIG. 1 and FIG. 2 illustrate the contact pins 13 and the test pins 141 as rectangles, and the alignment pins 18 on the two ends as "T", for example, but in a specific implementation, the contact pins 13, the test pins 141, and the alignment pins 18 can alternatively be arranged in other shapes and sizes. The shapes and sizes of the contact pins 13, the test pins 141, and the alignment pins 18 will not be limited to any specific shapes and sizes in the embodiment of the disclosure.

In some embodiments, in the display panel above, as illustrated in FIG. 4 and FIG. 5, at least three test pad groups 12 are arranged in the first bonding area 201 above.

The test pad groups 12 are located respectively at the center and two ends of the first bonding area 201.

In FIG. 4 and FIG. 5, three test pad groups 12 are arranged in the first bonding area 201, for example, and although all the contact pads 11 on the display panel are bonded with the corresponding contact pins 13 on the flexible printed circuit under the same process condition in the bonding process, there may be different bonding effects in different regions, so a plurality of test pad groups 12 can be arranged to thereby improve the reliability of detecting the bonding effects. In some embodiments, three test pad groups 12 are arranged, and the test pad groups 12 are arranged respectively at the center and two ends of the first bonding area 201 in the embodiment of the disclosure. In some embodiments, another number of test pad groups 12 can be arranged, and they can be distributed as needed in reality. The number and distribution of test pad groups 12 will not be limited to any specific number and distribution in the embodiment of the disclosure.

Alike, as illustrated in FIG. 1 and FIG. 2, at least three corresponding test pin groups 14 (three test pin groups as illustrated by way of an example) may be arranged in the second bonding area 202 above.

The test pin groups 14 are located respectively at the center and two ends of the second bonding area 202.

Specifically in the display panel above according to the embodiment of the disclosure, as illustrated in FIG. 4, the test pad group 12 can include three test pads 121, where two test pads 121 connected with each other are two test pads 121 spaced by another test pad.

Referring to FIG. 4, test pads 121 in the same test pad group 12 are a pad 1, a pad 2, and a pad 3 respectively, for example, where the pad 1 is connected with the pad 3, and after the respective contact pads 11 and the test pads 121 on the display panel are bonded with the contact pins 13 and the test pins 141 on the flexible printed circuit, resistances between the test pins 141 are tested directly using a multi-meter or probes, and when test pins 141 corresponding to adjacent test pads 121 (the pad 1 and the pad 2, or the pad 2 and the pad 3) are detected to be conducting, then short-circuiting in bonding may be determined; when test pins 141 corresponding to test pads 121 spaced by another test pad (the pad 1 and the pad 3) are detected to be non-conducting, then open-circuiting in bonding may be determined; and only when test pins 141 corresponding to adjacent test pads 121 (the pad 1 and the pad 2, and the pad 2 and the pad 3) are detected to be non-conducting, and test pins 141 corresponding to test pads 121 spaced by another test pad (the pad 1 and the pad 3) are detected to be conducting, then good bonding is determined.

Furthermore as illustrated in FIG. 5, two adjacent test pads 121 can be arranged connected with each other.

Referring to FIG. 5, also the test pads 121 in the same test pad group 12 are a pad 1, a pad 2, and a pad 3 respectively, for example, where the pad 1 is connected with the pad 2, and after the respective contact pads 11 and the test pads 121 on the display panel are bonded with the contact pins 13 and the test pins 141 on the flexible printed circuit, resistances between the test pins 141 are tested directly using a multi-meter or probes, and when test pins 141 corresponding to test pads 121 connected with each other (the pad 1 and the pad 2) are detected to be conducting, then open-circuiting in bonding may be determined; when test pins 141 corresponding to test pads 121 disconnected from each other (the pad 1 and the pad 3, or the pad 2 and the pad 3) are detected to be conducting, then short-circuiting in bonding may be determined; and only when test pins 141 corresponding to test pads 121 connected with each other (the pad 1 and the pad 2) are detected to be conducting, and test pins 141 corresponding to test pads 121 disconnected from each other (the pad 1 and the pad 3, and the pad 2 and the pad 3) are detected to be non-conducting, then good bonding is determined.

Alike in some embodiments, as illustrated in FIG. 1, the above test pin group 14 may include three test pins 141, where two test pins 141 connected with each other are two test pins 141 spaced by another test pin.

In some embodiments, in the display panel above, as illustrated in FIG. 3, the respective test pads 121 in the test pad group 12 are arranged floating. The first test terminals 15 connected with the test pads 121 in a one-to-one manner are arranged in the first bonding area 201, where the first test terminals 15 are connected with the corresponding test pads 121 through wires.

The first test terminals 15 connected with the test pads 121 in a one-to-one manner are arranged so that after the display panel is bonded with the flexible printed circuit, resistances between the first test terminals 15 can be detected directly using a multi-meter or probes without inserting any probes into the test pads 121, to thereby avoid the test pads 121 from being damaged. In some embodiments, the material of the first test terminals 15 may or may not be the same as the material of the test pads 121, and for example, the first test terminals 15 may be made of copper. The first test terminals 15 are squares as illustrated by way of an example, but in a specific implementation, the first test terminals 15 can alternatively be in another shape, e.g., a round, a triangle, etc., and the shape of the first test terminals 15 will not be limited to any specific shape in the embodiment of the disclosure.

Alike as illustrated in FIG. 6, the respective test pins 141 in the test pin group 14 are arranged floating, and second test terminals 16 connected with the test pins 141 in a one-to-one manner are arranged in the second bonding area 202, where the second test terminals 16 are connected with the corresponding test pins 141 through wires.

The second test terminals 16 connected with the test pins 141 in a one-to-one manner are arranged so that after the display panel is bonded with the flexible printed circuit, resistances between the second test terminals 16 can be detected directly using a multi-meter or probes without inserting any probes into the test pins 141, to thereby avoid the test pins 141 from being damaged. In some embodiments, the material of the second test terminals 16 may or may not be the same as the material of the test pins 141, and for example, the second test terminals 16 may be made of copper. The second test terminals 16 are rounds as illustrated by way of an example, but in a specific implementation, the second test terminals 16 can alternatively be in another shape, e.g., a square, a triangle, etc., and the shape of the second test terminals 16 will not be limited to any specific shape in the embodiment of the disclosure.

FIG. 7A is a schematic structural diagram of the display panel illustrated in FIG. 4 bonded with the flexible printed circuit illustrated in FIG. 6, and FIG. 7B is a partial enlarged of FIG. 7A. Referring to FIG. 7B, after the display panel is bonded with the flexible printed circuit, the bonding state can be determined by detecting the resistances between the second test terminals 16, and specifically when second test terminals 16 corresponding to test pads 121 disconnected from each other are detected to be conducting, then short-circuiting in bonding may be determined; when second test terminals 16 corresponding to test pads 121 connected with each other are detected to be non-conducting, then open-circuiting in bonding may be determined; and only when second test terminals 16 corresponding to test pads 121 disconnected from each other are detected to be non-conducting, and second test terminals 16 corresponding to test pads 121 connected with each other are detected to be conducting, then good bonding is determined.

In another aspect, an embodiment of the disclosure further provides a detection method of the display panel above. As illustrated in FIG. 4 or FIG. 5, each test pad group 12 includes at least two test pads 121 connected with each other and at least two test pads 121 disconnected from each other, and the corresponding test pins 141 in the corresponding test pin group 14 are arranged floating (as illustrated in FIG. 6).

Figure 8:
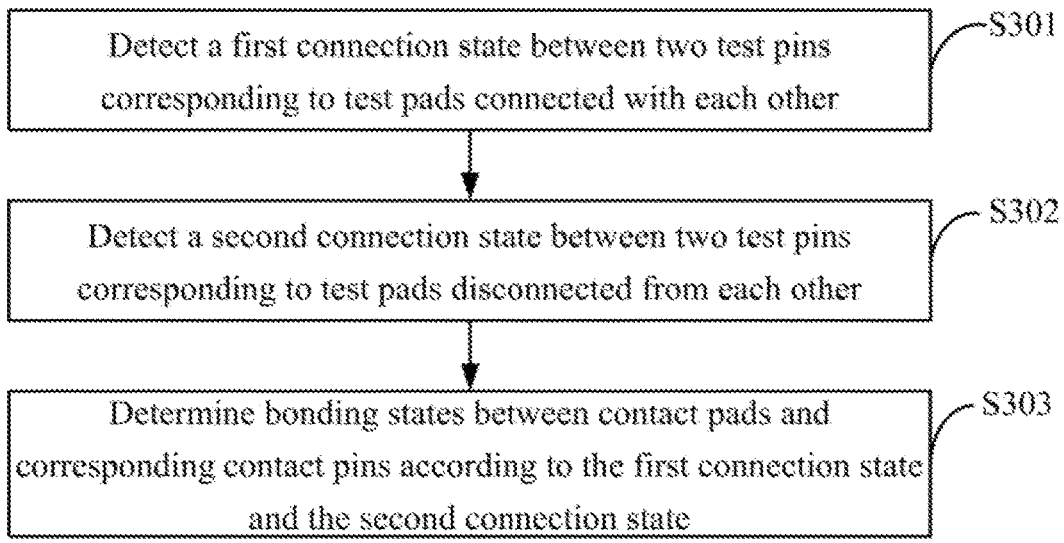
FIG. 8 is a first flow chart of a detection method of the display panel in accordance with an embodiment of the disclosure.

As illustrated in FIG. 8, the detection method above can include the following steps.

The step S301 is to detect a first connection state between two test pins corresponding to test pads connected with each other.

The step S302 is to detect a second connection state between two test pins corresponding to test pads disconnected from each other.

The step S303 is to determine bonding states between contact pads and corresponding contact pins according to the first connection state and the second connection state, where when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

In the embodiment of the disclosure, the bonding state above can refer to a contact condition between the contact pad and the corresponding contact pin (or a test pad and a corresponding test pin). The contact condition can include two conditions of good and poor contacts. The good bonding above can refer to good conducting between the contact pad and the corresponding contact pin, and no short-circuiting occurs between adjacent contact pads, adjacent contact pins, or a contact pad and a contact pin adjacent thereto. The poor contact can refer to non-conducting between the contact pad and the corresponding contact pin, that is, no signal can be transmitted between the contact pad and the contact pin, i.e., open-circuiting in bonding, or the poor contact can refer to short-circuiting between adjacent contact pads, adjacent contact pins, or a contact pad and a contact pin adjacent thereto, i.e., short-circuiting in bonding.

In the step S303 above, in a real application, taking the structure illustrated in FIG. 7B as an example, when there is good bonding, then there shall be a conducting state between the test pins corresponding to the test pads connected with each other, and open-circuiting between the test pins corresponding to the test pads disconnected from each other, so the detected first connection state is conducting, and the detected second connection state is non-conducting. When there is open-circuiting in bonding, then the detected first connection state is non-conducting; and when there is short-circuiting in bonding, then the detected second connection state is conducting. Accordingly the bonding state between the contact pad and the corresponding contact pin can be determined according to the first connection state and the second connection state.

In the step S301 or the step S302 above, in some embodiments, the connection state can be determined by detecting a resistance between the test pins corresponding to the test pads, and for example, in the case of good bonding, the resistance between the two test pins corresponding to the test pads connected with each other is a low normal resistance, and the resistance between the two test pins corresponding to the test pads disconnected from each other is infinite, so the connection state can be determined by setting a threshold. For example, a resistance more than the normal resistance can be set as a threshold, and when the detected resistance between the test pins is above the threshold, then the connection state is non-conducting; otherwise, the connection state is conducting.

In some embodiments, in the detection method above, second test terminals 16 connected with the test pins 141 in a one-to-one manner are arranged in the second bonding area 202 as illustrated in FIG. 6.

The step S301 above can include: detecting a connection state between the two second test terminals corresponding to the test pads connected with each other.

The step S302 above can include: detecting a connection state between the two second test terminals corresponding to the test pads disconnected from each other.

The second test terminals connected with the test pins in a one-to-one manner are arranged so that after the display panel is bonded with the flexible printed circuit, a resistance between the second test terminals can be detected directly using a multi-meter or probes without inserting any probes into the test pins, to thereby avoid the test pins from being damaged. In some embodiments, the material of the second test terminals may be different from the material of the test pins, and for example, the second test terminals can be made of copper.

In one more another aspect, an embodiment of the disclosure further provides a detection method of the display panel above. As illustrated in FIG. 1 or FIG. 2, each test pin group 14 includes at least two test pins 141 connected with each other and at least two test pins 141 disconnected from each other, and the corresponding test pins 141 in the corresponding test pin group 14 are arranged floating.

Figure 9:
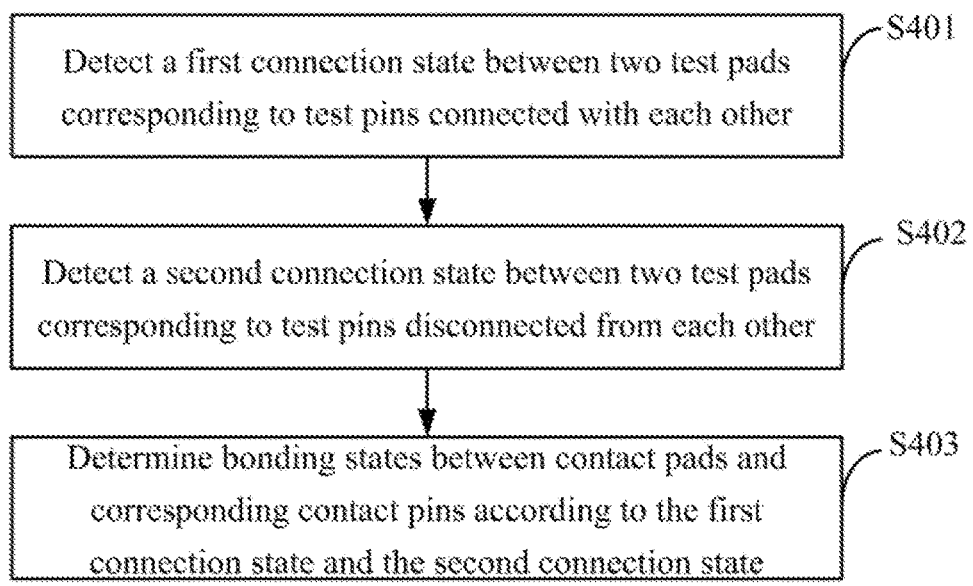
FIG. 9 is a second flow chart of a detection method of the display panel in accordance with an embodiment of the disclosure.

As illustrated in FIG. 9, the detection method above can include the following steps.

The step S401 is to detect a first connection state between two test pads corresponding to test pins connected with each other.

The step S402 is to detect a second connection state between two test pads corresponding to test pins disconnected from each other.

The step S403 is to determine bonding states between contact pads and corresponding contact pins according to the first connection state and the second connection state, where when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

In the embodiment of the disclosure, the bonding state above can refer to a contact condition between the contact pin and the corresponding contact pad (or a test pin and a corresponding test pad). The contact condition can include two conditions of good and poor contacts. The good bonding above can refer to good conducting between the contact pin and the corresponding contact pad, and no short-circuiting occurs between adjacent contact pins, adjacent contact pads, or a contact pin and a contact pad adjacent thereto. The poor contact can refer to non-conducting between the contact pin and the corresponding contact pad, that is, no signal can be transmitted between the contact pin and the contact pad, i.e., open-circuiting in bonding, or the poor contact can refer to short-circuiting between adjacent contact pins, adjacent contact pads, or a contact pin and a contact pad adjacent thereto, i.e., short-circuiting in bonding.

In the step S403 above, when there is good bonding, then there shall be a conducting state between the test pads corresponding to the test pins connected with each other, and open-circuiting between the test pads corresponding to the test pins disconnected from each other, so the detected first connection state is conducting, and the detected second connection state is non-conducting; when there is open-circuiting in bonding, then the detected first connection state is non-conducting; and when there is short-circuiting in bonding, then the detected second connection state is conducting. Accordingly the bonding state between the contact pin and the corresponding contact pad can be determined according to the first connection state and the second connection state.

In the step S401 or the step S402 above, in some embodiments, the connection state can be determined by detecting a resistance between the test pads corresponding to the test pins. For example, in the case of good bonding, the resistance between the two test pads corresponding to the test pins connected with each other is a low normal resistance, and the resistance between the two test pads corresponding to the test pins disconnected from each other is infinite, so the connection state can be determined by setting a threshold. For example, a resistance more than the normal resistance can be set as a threshold, and when the detected resistance between the test pads is above the threshold, then the connection state is non-conducting; otherwise, the connection state is conducting.

In some embodiments, in the detection method above, first test terminals 15, connected with the test pads 121 in a one-to-one manner, are arranged in the first bonding area 201 as illustrated in FIG. 3.

The step S401 above can include: detecting a connection state between two first test terminals corresponding to the test pins connected with each other.

The step S402 above can include: detecting a connection state between two first test terminals corresponding to the test pins disconnected from each other.

The first test terminals connected with the test pads in a one-to-one manner are arranged so that after the display panel is bonded with the flexible printed circuit, a resistance between the first test terminals can be detected directly using a multi-meter or probes without inserting any probes into the test pins, to thereby avoid the test pins from being damaged.

In one more another aspect, an embodiment of the disclosure further provides a display device including the display panel above.

The display device can be applicable to a mobile phone, a tablet computer, a TV set, a display, a notebook computer, a digital photo frame, a navigator, or any other product or component with a display function. Since the display device addresses the problem under a similar principle to the display panel, reference can be made to the implementation of the display panel above for an implementation of the display device, and a repeated description thereof will be omitted here.

In the display panel, the detection method thereof, the flexible printed circuit, and the display device according to the embodiment of the disclosure, the test pin group is arranged in the second bonding area so that after the flexible printed circuit is subsequently bonded with the display panel, a bonding state between the display panel and the flexible printed circuit can be determined by detecting the conducting or non-conducting states between the test pins and the corresponding test pads, and in this way, a bonding effect can be detected in effect, rapidly, and in a simple process without any additional process.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising: a base substrate, a first bonding area on the base substrate, and a flexible printed circuit, wherein:
   the flexible printed circuit comprises:
   a second bonding area; and
   a plurality of contact pins and at least one test pin group are arranged in the second bonding area;
   the plurality of contact pins are connected with corresponding signal lines on the flexible printed circuit, and configured to be bonded respectively with a plurality of corresponding contact pads in the first bonding area;
   the test pin group is configured to be bonded with a corresponding test pad group in the first bonding area;
   the test pin group comprises a plurality of test pins, corresponding to a plurality of test pads in the test pad group; and
   the first bonding area is bonded with the second bonding area on the flexible printed circuit;
   the plurality of contact pads connected with corresponding signal lines on the display panel and at least one test pad group are arranged in the first bonding area;
   the test pad group comprises the plurality of test pads, and the test pads are configured to be bonded with the corresponding test pins in the second bonding area; and
   the test pad group or the test pin group is configured so that after the first bonding area is bonded with the second bonding area, bonding states of the plurality of contact pins with the plurality of contact pads are determined by detecting conducting or non-conducting state between the test pads and the corresponding test pads;
   wherein each test pad group comprises at least two test pads connected with each other and at least two test pads disconnected from each other, and the corresponding test pins in the corresponding test pin group are arranged floating; or
   each test pin group comprises at least two test pins connected with each other and at least two test pins disconnected from each other, and the corresponding test pads in the corresponding test pad group are arranged floating.

2. The display panel according to claim 1, wherein the contact pads and the test pads in the first bonding area are located in the same row or column, and the test pads are of the same size and shape as the contact pads; and
   the contact pins and the test pins in the second bonding area are located in the same row or column, and the test pins are of the same size and shape as the contact pins.

3. The display panel according to claim 2, wherein the spacing between any two adjacent pads among the test pads and the contact pads in the same row or column is the same; and the spacing between any two adjacent pins among the test pins and the contact pins in the same row or column is the same.

4. The display panel according to claim 2, wherein at least two alignment pads are arranged on two ends of the row or column of contact pads and test pads in the first bonding area; and at least two alignment pins are arranged on two ends of the row or column of contact pins and test pins in the second bonding area.

5. The display panel according to claim 2, wherein at least three test pad groups are arranged in the first bonding area, and the test pad groups are located respectively at the center and two ends of the first bonding area; and at least three corresponding test pin groups are arranged in the second bonding area, and the test pin groups are located respectively at the center and two ends of the second bonding area.

6. The display panel according to claim 1, wherein the test pad group comprises three test pads, and the two test pads connected with each other are two test pads spaced by another test pad; or the test pin group comprises three test pins, and the two test pins connected with each other are two test pins spaced by another test pin.

7. The display panel according to claim 1, wherein the test pads in the test pad group are arranged floating, and first test terminals connected with the test pads in a one-to-one manner are arranged in the first bonding area, wherein the first test terminals are connected with the corresponding test pads through wires; or the test pins in the test pin group are arranged floating, and second test terminals connected with the test pins in a one-to-one manner are arranged in the second bonding area, wherein the second test terminals are connected with the corresponding test pins through wires.

8. A detection method of the display panel according to claim 1, wherein each test pad group comprises at least two test pads connected with each other and two test pads disconnected from each other, and the corresponding test pins in the corresponding test pin group are arranged floating; and the detection method comprises:

detecting a first connection state between two test pins corresponding to the test pads connected with each other;

detecting a second connection state between two test pins corresponding to the test pads disconnected from each other; and determining bonding states between contact pads and corresponding contact pins according to the first connection state and the second connection state, wherein when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

9. The detection method of the display panel according to claim 8, wherein second test terminals, connected with the test pins in a one-to-one manner, are arranged in the second bonding area;

the detecting the first connection state between the two test pins corresponding to the test pads connected with each other comprises:

detecting a connection state between two second test terminals corresponding to the test pads connected with each other; and the detecting the second connection state between the two test pins corresponding to the test pads disconnected from each other comprises:

detecting a connection state between two second test terminals corresponding to the test pads disconnected from each other.

10. A detection method of the display panel according to claim 1, wherein each test pin group comprises at least two test pins connected with each other and at least two test pins disconnected from each other, and the corresponding test pads in the corresponding test pad group are arranged floating; and the detection method comprises:

detecting a first connection state between two test pads corresponding to the test pins connected with each other;

detecting a second connection state between two test pads corresponding to the test pins disconnected from each other; and determining bonding states between contact pads and corresponding contact pins according to the first connection state and the second connection state, wherein when the first connection state is non-conducting, then the bonding states are open-circuiting in bonding; when the second connection state is conducting, then the bonding states are short-circuiting in bonding; and when the first connection state is conducting, and the second connection state is non-conducting, then the bonding states are good bonding.

11. The detection method of the display panel according to claim 10, wherein first test terminals, connected with the test pins in a one-to-one manner, are arranged in the first bonding area;

the detecting the first connection state between the two test pads corresponding to the test pins connected with each other comprises:

detecting a connection state between two first test terminals corresponding to the test pins connected with each other; and the detecting the second connection state between the two test pads corresponding to the test pins disconnected from each other comprises:

detecting a connection state between two first test terminals corresponding to the test pins disconnected from each other.

12. A display device, comprising the display panel according to claim 1.

* * * * *